US008189109B2

United States Patent
Kuo et al.

(10) Patent No.: US 8,189,109 B2
(45) Date of Patent: May 29, 2012

(54) DIGITAL IMAGE CONVERTING APPARATUS WITH AUTO-CORRECTING PHASE AND METHOD THEREOF

(75) Inventors: Ming-Ho Kuo, Hsinchu (TW); Yi-Hua Lin, Taichung County (TW)

(73) Assignee: ITE Tech. Inc., Hsinchu (TW)

( * ) Notice: Subject to any disclaimer, the term of this patent is extended or adjusted under 35 U.S.C. 154(b) by 1114 days.

(21) Appl. No.: 12/046,435

(22) Filed: Mar. 11, 2008

(65) Prior Publication Data

US 2009/0161986 A1   Jun. 25, 2009

(30) Foreign Application Priority Data

Dec. 21, 2007   (TW) ............................... 96149272 A

(51) Int. Cl.
  *H03M 1/12*   (2006.01)
(52) U.S. Cl. ..................... 348/572; 348/537; 348/540
(58) Field of Classification Search .................. 348/572, 348/536, 537, 540, 541
  See application file for complete search history.

(56) References Cited

U.S. PATENT DOCUMENTS

| 6,268,848 | B1 * | 7/2001 | Eglit | 345/213 |
| 7,215,273 | B2 * | 5/2007 | Waldner | 341/155 |
| 7,463,256 | B2 * | 12/2008 | Meyer | 345/213 |
| 2006/0256119 | A1 * | 11/2006 | Xiu et al. | 345/520 |
| 2008/0292022 | A1 * | 11/2008 | Blum | 375/317 |

\* cited by examiner

*Primary Examiner* — Brian Pendleton
*Assistant Examiner* — Nnenna Ekpo

(57) ABSTRACT

A digital image converting apparatus with auto-correcting phase and a method thereof are provided. The digital image converting apparatus includes a phase controller, a delay locked loop (DLL), an analog-to-digital converter (ADC) and a position adjuster. The phase controller selects one of preset phases for outputting and continuously changes the output preset phase for controlling a clock signal produced by the delay locked loop. The ADC converts an analog display frame according to the adjusted clock signal. After all the preset phases are output in sequence, the phase controller can obtain an optimal phase for converting the display frame according to the smallest front porch of horizontal scan line and the smallest back porch of horizontal scan line of a digital display frame produced by the position adjuster.

13 Claims, 4 Drawing Sheets

| OUTPUT OF THE PHASE CONTROLLER 110 | SUM OF PIXEL NUMBERS | |
|---|---|---|
| PRESET PHASE $PH_1$ | 68 | — $AR_1$ |
| PRESET PHASE $PH_2$ | 67 | — $AR_2$ |
| PRESET PHASE $PH_3$ | 67 | — $AR_3$ |
| PRESET PHASE $PH_4$ | 67 | — $AR_4$ |
| PRESET PHASE $PH_5$ | 68 | — $AR_5$ |
| PRESET PHASE $PH_6$ | 68 | — $AR_6$ |
| PRESET PHASE $PH_7$ | 68 | — $AR_7$ |
| PRESET PHASE $PH_8$ | 68 | — $AR_8$ |
| PRESET PHASE $PH_9$ | 68 | — $AR_9$ |
| PRESET PHASE $PH_{10}$ | 69 | — $AR_{10}$ |
| ⋮ | ⋮ | |
| PRESET PHASE $PH_{n-1}$ | 68 | — $AR_{n-1}$ |
| PRESET PHASE $PH_n$ | 69 | — $AR_n$ |

$AR_5$–$AR_9$ grouped as 210

FIG. 2

DIGITAL IMAGE CONVERTING APPARATUS WITH AUTO-CORRECTING PHASE AND METHOD THEREOF

CROSS-REFERENCE TO RELATED APPLICATION

This application claims the priority benefit of Taiwan application serial no. 96149272, filed on Dec. 21, 2007. The entirety the above-mentioned patent application is hereby incorporated by reference herein and made a part of specification.

BACKGROUND OF THE INVENTION

1. Field of the Invention

The present invention generally relates to a method and an apparatus for converting analog images into digital images, and more particularly, to a method and an apparatus with auto-correcting phase for converting analog images into digital images.

2. Description of Related Art

Along with the progress in science and technology in recent years, a digital video system has gradually replaced a traditional analog video system. Accordingly, various digital audio/video products are more and more popular in our daily life, for example, audio/video disk, digital TV broadcast, image phone and video meeting.

To adapt the above-mentioned tendency with digital display, a digital video system often requires a digital image converting apparatus for converting an original analog display frame into a digital display frame. A common digital image converting apparatus includes an analog-to-digital converter (ADC) and a delay locked loop (DDL), wherein the DDL is for producing a clock signal and the ADC converts an analog display frame into a digital display frame according to the clock signal. Note that when the phase of the clock signal does not match the analog display frame, the digital video system would produce a blur frame.

In order to provide a solution targeting the above-mentioned problem, several conventional technologies are available currently, which are competent for correcting phases during converting an analog display frame into a digital display frame. The common conventional techniques are briefly depicted as follows.

The first one of the prior art utilizes a specific integrated circuit (specific IC) for locating the most appropriate edge within an analog display frame, wherein the so-called edge is an area having most-varied graylevels of pixels within the analog display frame. In addition, the first conventional technique further employs a DDL to adjust the phases of the clock signal produced by a phase locked loop (PLL), and the internal setting parameters of the DDL are controlled by a microprocessor. Whenever the DDL fine-adjusts the phase of the clock signal, the ADC would convert the analog display frame one time, and the microprocessor would record the value corresponding to the edge of the analog display frame into a registering block according to the converted frame. In this way, the microprocessor can locate a region in the registering block having the minimal continuous variation between a recorded value and the adjacent recorded value, wherein all values corresponding to the analog display frame are written in the registering block. Moreover, the microprocessor takes the phase corresponding to the middle position of the region as the optimal phase.

Note that during dynamically displaying frames, the edge of the analog display frame is varied with a motion of the images, which results in misjudging the optimal phase. In addition, to determine the most appropriate edge within an analog display frame, the first prior art must employ a specific IC having sophisticated circuit architecture to locate the appropriate edge within a display frame. In other words, the first prior art is suitable to search the optimal phase on a still analog display frame, not suitable for dynamic frames. In fact, the first prior art further is disadvantageous in a high system cost and requiring a sophisticated hardware architecture.

The second prior art is evolved from the first one, except that the second prior art uses an application software or a firmware initialization program to produce a specific analog display frame, where the edge on the specific analog display frame is given, so that the second prior art does not need a specific IC to search out the edge of a display frame.

However, during searching the optimal phase, a video system only displays the specific analog display frame and meanwhile the real frames must be quit for outputting. That is to say, the second prior art would produce a frame conflict issue, which degrades the display effect. In addition, a video system adopting the second prior art during a mass production needs to install an application software or a firmware initialization program for producing the specific analog display frame, which further affects the mass production yield.

SUMMARY OF THE INVENTION

Accordingly, the present invention is directed to a digital image converting method with auto-correcting phase, which is able to effectively lower the production cost and the complexity of the hardware architecture of a video system.

The present invention is also directed to a digital image converting apparatus with auto-correcting phase, which employs a phase controller to perform a series of analyses on the smallest front porches and smallest back porches of horizontal scan line of a digital display frame so as to obtain the optimal phase of the display frame during conversion.

The present invention provides a digital image converting method with auto-correcting phase, and the digital image converting method includes following steps. First, one of a plurality of preset phases is selected. Next, the selected preset phase is used to adjust the starting position of a clock signal and using the adjusted clock signal to convert an analog display frame into a digital display frame. Next, the smallest front porch of horizontal scan line and the smallest back porch of horizontal scan line of the digital display frame are captured. The pixel number corresponding to the smallest front porch of horizontal scan line is added with the pixel number corresponding to the smallest back porch of horizontal scan line and a sum of pixel numbers in a blank region of a registering block is recorded.

Note that the above-mentioned steps are executed repeatedly until the preset phase is selected in sequence. In other words, whenever the preset phase is updated, all the above-mentioned steps are repeated once. Once all the preset phases are selected in sequence, the sum of pixel numbers corresponding to every the preset phases is recorded in the registering block. At the time, a largest region in the registering block where the recorded sums of pixel numbers keep a specific value and are continuously distributed is termed as a specific region. Further, the recorded phase corresponding to the middle point of the specific region is chosen and considered as the optimal phase, and the optimal phase is used to perform analog-to-digital conversion on the analog display frames.

On the other hand, the present invention provides a digital image converting apparatus with auto-correcting phase, which includes a phase controller, a DLL, an ADC and a position adjuster. The phase controller herein selects one of preset phases for outputting, and the phase controller would continuously update the output preset phase until all of the preset phases are output in sequence. The DLL adjusts the starting position of a clock signal according to the output of the phase controller so as to output an adjusted clock signal.

The ADC uses the adjusted clock signal to perform an analog-to-digital conversion on an analog display frame and produce a digital display frame. The position adjuster is for obtaining the smallest front porch of horizontal scan line and the smallest back porch of horizontal scan line of a digital display frame. Then, the phase controller adds the pixel number corresponding to the smallest front porch of horizontal scan line with the pixel number corresponding to the smallest back porch of horizontal scan line and records a sum of pixel numbers in a blank region of a registering block.

Note that after the phase controller outputs all the preset phases in sequence, the sum of pixel numbers corresponding to each of the preset phases is recorded in the registering block. At this time, the phase controller takes a largest region in the registering block where the recorded sums of pixel numbers keep a specific value and are continuously distributed is termed as a specific region, so as to continuously output the optimal phases corresponding to the middle points of the specific region.

The present invention mainly uses the smallest front porch of horizontal scan line and the smallest back porch of horizontal scan line to make the phase controller obtain the sums of pixel numbers respectively corresponding to one of the preset phases. Further, the phase controller divides the distribution of the sums of pixel numbers according to a specific value so as to obtain the optimal phase during converting display frames. Since the present invention does not require to search for the edges of analog display frames and install any application software to achieve the effect of automatically adjusting phases. Therefore, compared to the prior art, the present invention is advantageous in effectively reducing the system cost and the complexity with the hardware architecture, and promoting the mass production yield and display effect of the video system.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a diagram of a registering block of the phase controller with the recorded sums of pixel numbers therein.

DESCRIPTION OF THE EMBODIMENTS

Figure 1:
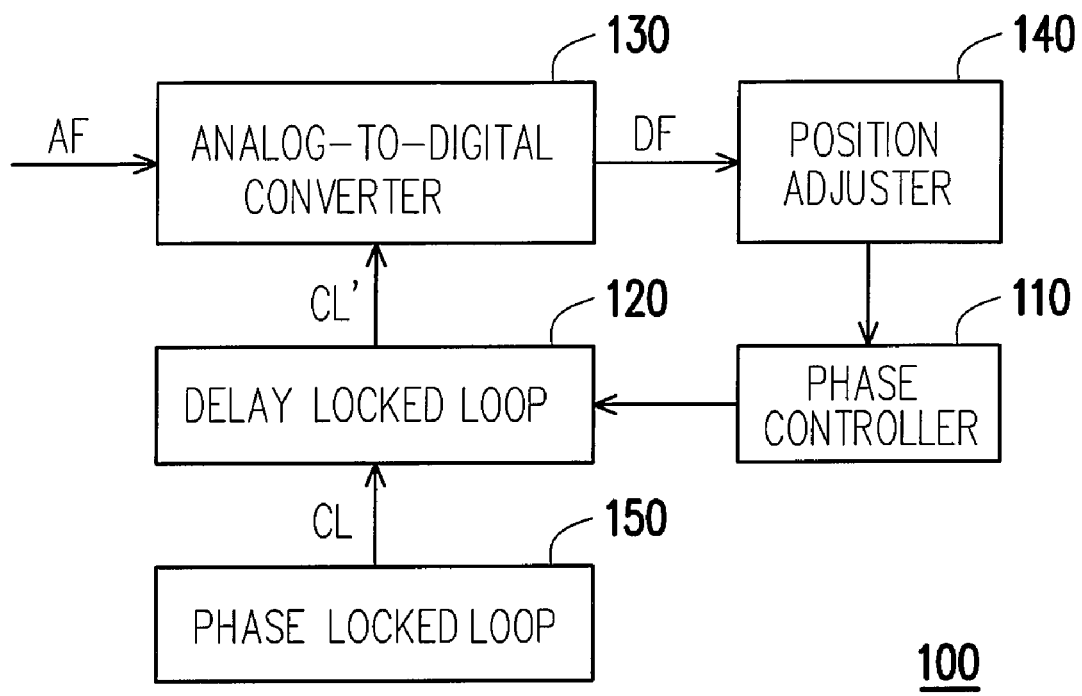
FIG. 1 is a circuit block diagram of a digital image converting apparatus with auto-correcting phase according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a circuit block diagram of a digital image converting apparatus with auto-correcting phase according to an embodiment of the present invention. Referring to FIG. 1, a digital image converting apparatus 100 includes a phase controller 110, a DLL 120, an ADC 130, a position adjuster 140 and a PLL 150. The DLL 120 herein is coupled to the phase controller 110 and the PLL 150, the ADC 130 is coupled to the DLL 120 and the position adjuster 140 is coupled between the ADC 130 and the phase controller 110.

In terms of general operation, the internal circuit of the phase controller 110 stores a plurality of preset phases $PH_1$-$PH_n$. First, the phase controller 110 selects one of the preset phases $PH_1$-$PH_n$ for output. In addition, the phase controller 110 would continuously change the preset phase output therefrom until all the preset phases $PH_1$-$PH_n$ are output in sequence.

The PLL 150 is employed for producing a clock signal CL and the DLL 120 would adjust the starting position of the clock signal CL according to the output of the phase controller 110 so as to output an adjusted clock signal CL'. Next, the ADC 130 uses the adjusted clock signal CL' to perform analog-to-digital conversion on an analog display frame AF to produce a digital display frame DF. The position adjuster 140 is employed for obtaining the smallest front porch of horizontal scan line and the smallest back porch of horizontal scan line of the digital display frame DF.

After that, the phase controller 110 adds the pixel number corresponding to the smallest front porch of horizontal scan line with the pixel number corresponding to the smallest back porch of horizontal scan line of the digital display frame DF and records the sum of pixel numbers in a blank region of a registering block. Note that whenever the output of the phase controller 110 is updated, the phase controller 110 will update the preset phase as well and the ADC 130 accordingly performs a frame converting. Therefore, after the phase controller 110 outputs the preset phases $PH_1$-$PH_n$ set by the phase controller in sequence, the sum of pixel number corresponding to each of the preset phases $PH_1$-$PH_n$ are recorded in the registering block.

In this way, after the phase controller 110 outputs the preset phases $PH_1$-$PH_n$ recorded therein in sequence, the phase controller 110 takes a largest region in the registering block where the recorded sums of pixel numbers keep a specific value and are continuously distributed as a specific region, so as to obtain the optimal phases corresponding to the middle points of the specific region. The phase controller 110 thereby continuously outputs the optimal phase, so that the delayed clock signal CL' is matched with the analog display frame AF.

FIG. 2 is a diagram of a registering block of the phase controller 110 with the recorded sums of pixel numbers therein. On the region $AR_1$ herein, for example, the sum of pixel numbers is recorded, wherein a sum of pixel numbers is the result obtained by adding the pixel numbers when the output of the phase controller 110 is the preset phase $PH_1$; similarly, on the region $AR_2$, another sum of pixel numbers is recorded, wherein the sum of pixel numbers is the result obtained by adding the pixel numbers when the output of the phase controller 110 is the preset phase $PH_2$, and analogically for the rest, so that other values are recorded on the other regions $AR_3$-$AR_n$.

Considering the resolution of a display frame today mostly is 1024×768, 1280×1024 m 640×480 or 800×600 and so on, therefore, the phase controller 110 in the embodiment would takes an even number greater than zero as a specific value. It can be seen from FIG. 2, the region $AR_5$-$AR_9$ is counted as the largest region in the registering block where the recorded sums of pixel numbers keep a specific value and are continuously distributed, and the phase controller 110 would take the region $AR_5$-$AR_9$ as a specific region, so as to obtain the optimal phase $PH_7$ corresponding to the middle points of the specific region 210.

Although the above-mentioned embodiment provides an implementation of a specific value, but anyone skilled in the art should know that, the above-mentioned resolution specification of frame may be modified with the amazing progress of science and technology today. Thus, the specific value set by the phase controller 110 is allowed to be an odd number greater than zero depending on a real resolution of frame. Besides, the phase controller 110 in the embodiment is implemented by a microprocessor, but it can be implemented by a specific IC as well.

Further, the analog display frame AF received by the ADC 130 during searching the phases by the digital image converting apparatus 100 can be dynamic display mode or still display mode. Compared to the prior art, the present invention is advantageous in saving a step for searching the edge of an analog display frame and there is no need to install an application software or a firmware initialization program to have the auto-adjusting phase. In short, the digital image converting apparatus 100 of the present invention is advantageous in not only reducing the system cost and the complexity of hardware architecture, but also promoting the mass production efficiency and the display quality of a video system.

In order to further explain the spirit of the embodiment, the working principle for the position adjuster 140 to obtain the smallest front porch of horizontal scan line and the smallest back porch of horizontal scan line of a digital display frame DF is described in more detail as follows.

Figure 3:
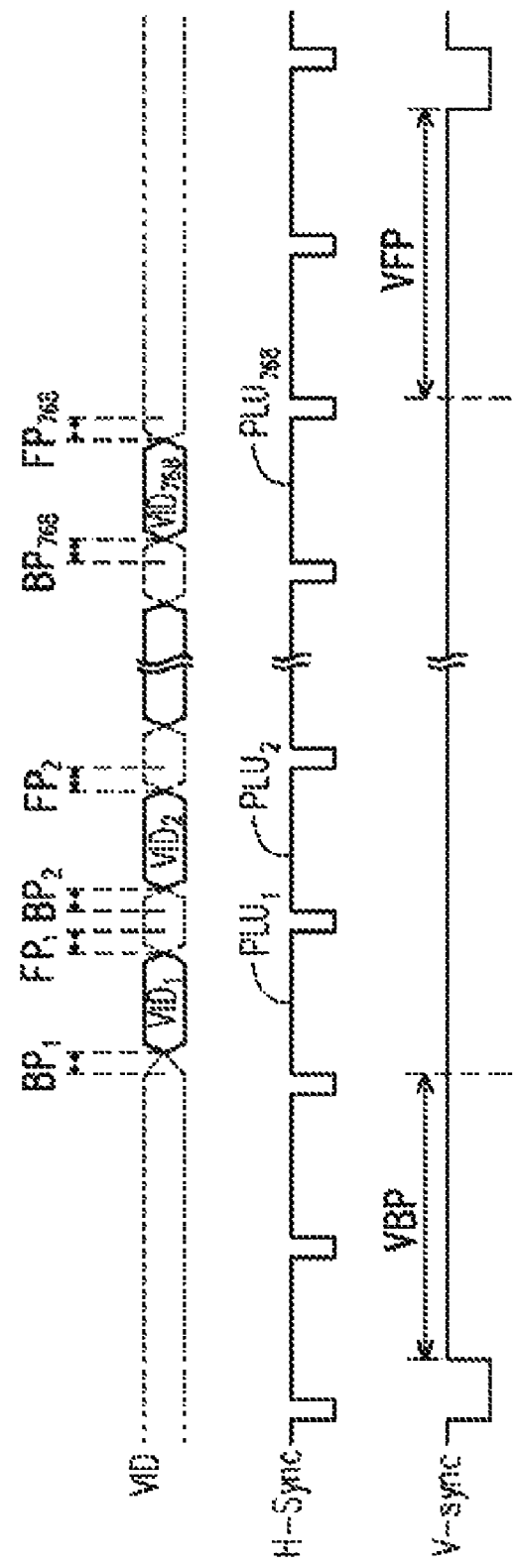
FIG. 3 is a signal timing diagram for describing the embodiment of FIG. 1.

FIG. 3 is a signal timing diagram for describing the embodiment of FIG. 1, wherein a horizontal synchronization signal H-sync, a vertical synchronization signal V-sync and an image signal VID are the major signals to form a digital display frame DF. The digital image converting apparatus 100 performs the above-mentioned procedures on a display frame, and the resolution of the display frame is assumed as 1024×768.

Referring to FIG. 3, the image signal VID would sequentially carry the image signals respectively corresponding to 768 pieces of horizontal scan lines $CL_1$-$CL_{768}$ between the back porch VBP and the front porch VFP of the vertical synchronization signal V-sync. For example, the horizontal scan line $CL_1$ corresponds to an image signal $VID_1$ and the horizontal scan line $CL_2$ corresponds to another image signal $VID_2$. The position adjuster 140 receives an image signal VID in association of the synchronization pulses $PLU_1$-$PLU_{768}$. For example, the position adjuster 140 receives the image signal $VID_1$ corresponding to the horizontal scan line $CL_1$ of the digital display frame DF in association of the synchronization pulse $PLU_1$. Similarly, the position adjuster 140 receives the image signal $VID_2$ corresponding to the horizontal scan line $CL_2$ of the digital display frame DF in association of the synchronization pulse $PLU_2$.

In more detail, during judging the front porches and the back porches of the image signals $VID_1$-$VID_{768}$ in association of the horizontal synchronization signal H-sync, the position adjuster 140 would compare each of the image signals $VID_1$-$VID_{768}$ with a preset value. The comparison procedure is based on the consideration that the noise makes the voltage levels of the front porches and the back porches of the image signals $VID_1$-$VID_{768}$ usually slightly greater than zero; thus, the position adjuster 140 needs to set a preset value (for example, '30') in advance, and when the voltage level of the image signal is less than the preset value, the corresponding portions of the image signals can be judged as the front porches or the back porches.

In other words, when the position adjuster 140 receives an image signal $VID_1$, the position adjuster 140 captures the front porch $FP_1$ and the back porch $BP_1$ of the image signal $VID_1$ according to the preset value; when the position adjuster 140 receives an image signal $VID_2$, the position adjuster 140 captures the front porch $FP_2$ and the back porch $BP_2$ of the image signal $VID_2$ according to the preset value. Analogically for the rest, the position adjuster 140 would sequentially capture the front porches $FP_1$-$FP_{768}$ and the back porches $BP_1$-$BP_{768}$. After that, the position adjuster 140 compares the front porches $FP_1$-$FP_{768}$ with one another and compares the back porches $BP_1$-$BP_{768}$ with one another, so that the smallest front porch among the front porches $FP_1$-$FP_{768}$ and the smallest back porch among the back porches $BP_1$-$BP_{768}$ are respectively considered as the smallest front porch of horizontal scan line and the smallest back porch of horizontal scan line of the digital display frame DF.

Figure 4:
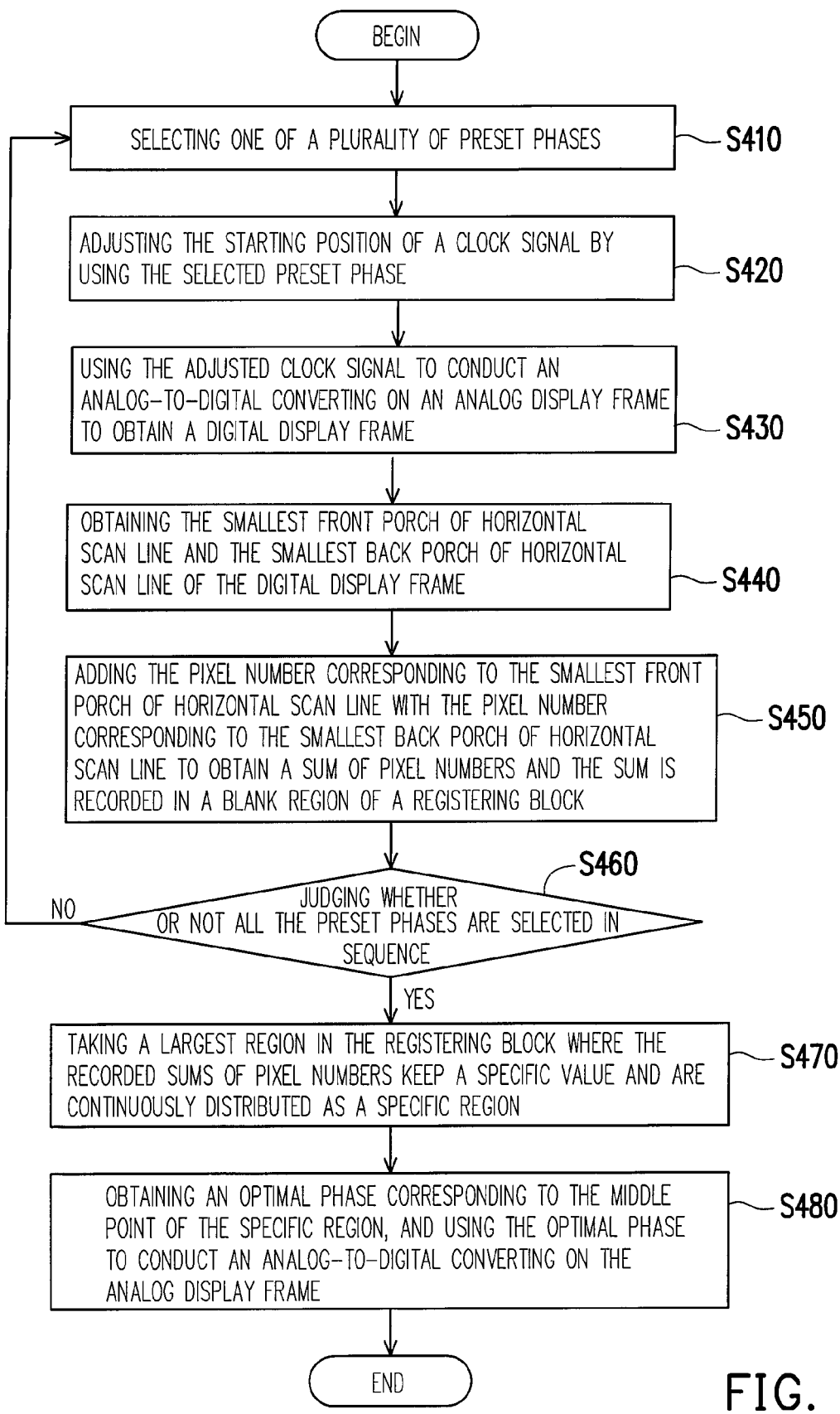
FIG. 4 is a flowchart of the method for converting analog images to digital images with auto-correcting phase according to an embodiment of the present invention.

FIG. 4 is a flowchart of the method for converting analog images to digital images with auto-correcting phase according to an embodiment of the present invention, wherein the method flowchart in the present embodiment is similar to the procedure flowchart of the digital image converting apparatus in the last embodiment.

First in step S410, one of a plurality of preset phases is selected. Next in step S420, the starting position of a clock signal is adjusted by using the selected preset phase. Then in step S430, the adjusted clock signal is used to perform an analog-to-digital conversion on an analog display frame to obtain a digital display frame. After that in step S440 and S450, the smallest front porch of horizontal scan line and the smallest back porch of horizontal scan line of the digital display frame are respectively obtained, and a sum of pixel numbers is obtained by adding the pixel number corresponding to the smallest front porch of horizontal scan line with the pixel number corresponding to the smallest back porch of horizontal scan line, wherein the sum of pixel numbers is recorded in a blank region of the registering block.

In order to sequentially use the above-mentioned preset phases to perform analog-to-digital conversion on the analog display frame, in step S460, it is judged whether or not all the preset phases are selected in sequence. If not all the preset phases are selected, the steps S410-S460 are repeated; otherwise, the flowchart proceeds to step S470 and step S480.

Along with that all the preset phases are selected in sequence, the sums of pixel numbers respectively corresponding to each preset phase are recorded in the registering block, in step S470, a largest region in the registering block where the recorded sums of pixel numbers keep a specific value and are continuously distributed is taken as a specific region. Furthermore, in step S480, an optimal phase corresponding to the middle point of the specific region is obtained, and the optimal phase is used to perform an analog-to-digital conversion on the analog display frame. More details of the method are included in the previous embodiment, thus they are omitted to describe.

In summary, the present invention uses the smallest front porch of horizontal scan line and the smallest back porch of horizontal scan line to make the phase controller obtain the sums of pixel numbers respectively corresponding to one of the preset phases. Further, the phase controller divides the distribution of the sums of pixel numbers according to a specific value so as to obtain the optimal phase corresponding to the middle point of a specific region. In this way, the clock signal adjusted by using the optimal phase is matched with the analog display frame.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital image converting method with auto-correcting phase, comprising the steps of:
   a. selecting one of a plurality of preset phases;
   b. using the selected preset phase to adjust the starting position of a clock signal;
   c. using the adjusted clock signal to perform analog-to-digital conversion on an analog display frame to obtain a digital display frame, wherein the digital display frame comprises a plurality of horizontal scan lines, wherein each of the plurality of the horizontal scan lines comprises a back porch and a front porch, wherein each porch has a number of pixels therein respectively;
   d. obtaining a smallest front porch among the front porches of the plurality of horizontal scan lines of the digital display frame, wherein the smallest front porch has the smallest number of pixels among the said front porches and a smallest back porch among the back porches of the plurality of horizontal scan lines of the digital display frame, wherein the smallest back porch has the smallest number of pixels among the said back porches;
   e. adding the number of pixels of the smallest front porch with the number of pixels of the smallest back porch to obtain a sum of pixel numbers and recording the sum of pixel numbers into a blank region of a registering block;
   f. judging whether or not all the preset phases are selected in sequence, wherein if all the preset phases are not selected in sequence, the above-mentioned steps are repeated; if all the preset phases are selected in sequence, a largest region in the registering block is taken as a specific region, wherein the recorded sums of pixel numbers in the specific region keep a specific value and are continuously distributed; and
   g. obtaining an optimal phase corresponding to a middle point of the specific region and using the optimal phase to perform analog-to-digital conversion on the analog display frame.

2. The digital image converting method with auto-correcting phase according to claim 1, wherein step d comprises the sub-steps of:
   d1. for each of the plurality of horizontal scan lines in the digital display frame, capturing the front porch and the back porch of the image signal of the horizontal scan line respectively; and
   d2. comparing the front porches of the image signal of the horizontal scan lines with one another and comparing the back porches of the image signal of the horizontal scan lines with one another so as to take the smallest front porch and the smallest back porch of the image signal of the horizontal scan lines as the smallest front porch of horizontal scan line and the smallest back porch of horizontal scan line of the digital display frame respectively.

3. The digital image converting method with auto-correcting phase according to claim 2, wherein step d1 comprises the sub-steps of:

d11. selecting one of the horizontal scan lines as a specific horizontal scan line;
   d12. comparing the image signal corresponding to the specific horizontal scan line with a preset value to judge the front porch and the back porch of the image signal of the specific horizontal scan line; and
   d13. repeating the above-mentioned steps until all the horizontal scan lines are selected in sequence.

4. The digital image converting method with auto-correcting phase according to claim 1, wherein the analog display frame is a dynamic video frame or a still video frame.

5. The digital image converting method with auto-correcting phase according to claim 1, wherein the specific value is an odd number greater than zero.

6. The digital image converting method with auto-correcting phase according to claim 1, wherein the specific value is an even number greater than zero.

7. A digital image converting apparatus with auto-correcting phase, comprising:
   a phase controller, for selecting one of a plurality of preset phases for output, wherein the phase controller continuously updates the output preset phase until all the preset phases are output in sequence;
   a delay locked loop, coupled to the phase controller and using the output of the phase controller to adjust the starting position of a clock signal and to output the adjusted clock signal;
   an analog-to-digital converter, coupled to the delay locked loop and using the adjusted clock signal to perform analog-to-digital conversion on an analog display frame so as to produce a digital display frame, wherein the digital display frame comprises a plurality of horizontal scan lines, wherein each of the plurality of the horizontal scan lines comprises a back porch and a front porch, wherein each porch has a number of pixels therein respectively; and
   a position adjuster, coupled between the analog-to-digital converter and the phase controller for obtaining a smallest front porch among the front porches of the plurality of horizontal scan lines of the digital display frame, wherein the smallest front porch has the smallest number of pixels among the said front porches and a smallest back porch among the back porches of the plurality of horizontal scan lines of the digital display frame, wherein the smallest back porch has the smallest number of pixels among the said back porches,
   wherein the phase controller adds the number of pixels corresponding to the smallest front porch of horizontal scan line and the number of pixels corresponding to the smallest back porch of horizontal scan line to obtain a sum of pixel numbers; the phase controller records the sum of pixel numbers into a blank region of a registering block, and after the phase controller outputs the preset phases in sequence, a largest region in the registering block is taken as a specific region, wherein the recorded sums of pixel numbers in the specific region keep a specific value and are continuously distributed, and the phase controller continuously outputs an optimal phase corresponding to a middle point of the specific region.

8. The digital image converting apparatus with auto-correcting phase according to claim 7, wherein the position adjuster compares the image signal corresponding to each of a plurality of horizontal scan lines in the digital display frame with a preset value in sequence to capture the front porches and the back porches of the image signal respectively corresponding to each of the horizontal scan lines, the position adjuster further compares the front porches with one another to determine the smallest front porch in the image signal corresponding to the horizontal scan lines and compares the back porches with one another to determine the smallest back porch in the image signal corresponding to the horizontal scan lines, and the position adjuster furthermore takes the above-mentioned smallest front porch and back porch respectively as the smallest front porch of horizontal scan line of the digital display frame and the smallest back porch of horizontal scan line of the digital display frame.

9. The digital image converting apparatus with auto-correcting phase according to claim 7 further comprising a phase locked loop, coupled to the delay locked loop for producing the clock signal.

10. The digital image converting apparatus with auto-correcting phase according to claim 7, wherein the position adjuster is composed of a microprocessor.

11. The digital image converting apparatus with auto-correcting phase according to claim 7, wherein the analog display frame is a dynamic video frame or a still video frame.

12. The digital image converting apparatus with auto-correcting phase according to claim 7, wherein the specific value is an odd number greater than zero.

13. The digital image converting apparatus with auto-correcting phase according to claim 7, wherein the specific value is an even number greater than zero.

* * * * *